(12) United States Patent
Ishino et al.

(10) Patent No.: US 11,362,641 B2
(45) Date of Patent: Jun. 14, 2022

(54) PIEZOELECTRIC RESONATOR DEVICE

(71) Applicant: DAISHINKU CORPORATION, Kakogawa (JP)

(72) Inventors: Satoru Ishino, Kakogawa (JP); Yuka Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

(21) Appl. No.: 17/312,943

(22) PCT Filed: Dec. 12, 2019

(86) PCT No.: PCT/JP2019/048700
§ 371 (c)(1),
(2) Date: Jun. 11, 2021

(87) PCT Pub. No.: WO2020/122179
PCT Pub. Date: Jun. 18, 2020

(65) Prior Publication Data
US 2022/0014173 A1  Jan. 13, 2022

(30) Foreign Application Priority Data
Dec. 14, 2018  (JP) .............................. JP2018-234555

(51) Int. Cl.
*H03H 9/10* (2006.01)
*H03B 5/32* (2006.01)
(52) U.S. Cl.
CPC ............. *H03H 9/1035* (2013.01); *H03B 5/32* (2013.01)

(58) Field of Classification Search
CPC .... H03H 9/02133; H03H 9/0547; H03H 9/02; H03H 9/02102; H03H 9/0523;
(Continued)

(56) References Cited

U.S. PATENT DOCUMENTS

| 5,406,230 A | 4/1995 | Yamamoto |
| 6,087,759 A | 7/2000 | Pfeil |

(Continued)

FOREIGN PATENT DOCUMENTS

| JP | 2010-252051 A | 11/2010 |
| JP | 2012-034086 A | 2/2012 |
| JP | 2017-108385 A | 6/2017 |

OTHER PUBLICATIONS

Computer translation of JP2017108385 (Year: 2017).*

*Primary Examiner* — Jeffrey M Shin
(74) *Attorney, Agent, or Firm* — Metrolex IP Law Group, PLLC (57) ABSTRACT

In a piezoelectric resonator device according to an embodiment, an internal space is formed by bonding a first sealing member to a crystal resonator plate and bonding a second sealing member to the crystal resonator plate. The internal space hermetically seals a vibrating part including a first excitation electrode and a second excitation electrode of the crystal resonator plate. Seal paths that hermetically seal the vibrating part of the crystal resonator plate are formed to have an annular shape in plan view. A plurality of external electrode terminals is formed on a second main surface of the second sealing member to be electrically connected to an external circuit board. The external electrode terminals are respectively disposed on and along an external frame part surrounding the internal space in plan view.

15 Claims, 8 Drawing Sheets

(58) Field of Classification Search
CPC ...... H03H 9/0552; H03H 9/1035; H03H 9/19; H03B 5/35
See application file for complete search history.

(56) References Cited

U.S. PATENT DOCUMENTS

| | | |
|---|---|---|
| 8,362,676 B2 | 1/2013 | Morita |
| 2002/0135429 A1 | 9/2002 | Akagawa et al. |
| 2004/0217673 A1* | 11/2004 | Unno .................. H03H 9/1021 310/348 |

* cited by examiner

PIEZOELECTRIC RESONATOR DEVICE

TECHNICAL FIELD

The present invention relates to a piezoelectric resonator device.

BACKGROUND ART

Recently, in various electronic devices, the operating frequencies have increased and the package sizes (especially, the heights) have decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to be Solved by the Invention

The above piezoelectric resonator device includes a plurality of external electrode terminals (rear surface electrode terminals) that is formed on a second main surface out of a first main surface (one main surface) and the second main surface (the other main surface) of the second sealing member so as to be electrically connected to an external circuit board. Also, a sealing part (seal path) is formed to have an annular shape in plan view so as to hermetically seal the vibrating part of the piezoelectric resonator plate.

When the piezoelectric resonator device is mounted on an external circuit board, the external electrode terminals are connected to the external circuit board using a conductive adhesive such as solder. Since the conductive adhesive such as solder contracts at the time of mounting the piezoelectric resonator device on the external circuit board, tensile stress or compressive stress acts on the second sealing member in the long-side direction via the external electrode terminals. That is, when mounting the piezoelectric resonator device on the external circuit board, the stress is generated to deform and warp the second sealing member, and this stress may affect the seal path.

Conventionally, a plurality of external electrode terminals is disposed so as to cover almost all the area of the second main surface of the second sealing member, and the above problem of deformation of the second sealing member due to stress is not addressed. Thus, when mounting the piezoelectric resonator device on the external circuit board, the stress derived from deformation of the second sealing member may increase to affect the seal path.

The present invention was made in consideration of the above circumstances, an object of which is to provide a piezoelectric resonator device capable of reducing stress affecting a sealing part that hermetically seals a vibrating part of a piezoelectric resonator plate when mounting the piezoelectric resonator device on an external circuit board.

Means for Solving the Problem

In order to solve the above problems, a piezoelectric resonator device of the present invention includes: a piezoelectric resonator plate including a first excitation electrode that is formed on a first main surface of a substrate, and a second excitation electrode that is formed on a second main surface of the substrate and that makes a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and furthermore bonding the second sealing member to the piezoelectric resonator plate. The internal space hermetically seals a vibrating part including the first excitation electrode and the second excitation electrode of the piezoelectric resonator plate. A sealing part that hermetically seals the vibrating part of the piezoelectric resonator plate is formed so as to have an annular shape in plan view. A plurality of external electrode terminals electrically connected to an external circuit board is formed on a second main surface out of a first main surface and the second main surface of the second sealing member, and each of the plurality of external electrode terminals is disposed on and along an external frame part surrounding the internal space in plan view.

With the above-described configuration, each of the external electrode terminals is disposed on and along the external frame part in plan view. Therefore, it is possible to make the part of the external electrode terminal that is superimposed on the internal space as small as possible. In this way, it is possible to reduce stress that acts on the sealing part because of deformation of the second sealing member when the piezoelectric resonator device is mounted on the external circuit board, and thus, it is possible to improve airtightness of the sealing part.

In the above-described configuration, it is preferable that each of the plurality of external electrode terminals is superimposed on only the external frame part in plan view.

With the above-described configuration, the external electrode terminals are not needed to have a part that is superimposed on the internal space. In this way, it is possible to reduce stress that acts on the sealing part because of deformation of the second sealing member when the piezoelectric resonator device is mounted on the external circuit board, and thus, it is possible to further improve airtightness of the sealing part.

In the above-described configuration, it is preferable that each of the plurality of external electrode terminals is located on a corresponding corner part on the second main surface of the second sealing member. In this case, it is more preferable that the plurality of external electrode terminals is respectively located on four corners on the second main surface of the second sealing member. Also, it is further preferable that each of the plurality of external electrode terminals is formed so as to have a substantially L-shape in plan view.

With the above-described configuration, it is possible to make efficiently use of the limited area of the external frame part to provide the external electrode terminals thereon.

Effect of the Invention

With the piezoelectric resonator device of the present invention, each of the external electrode terminals is disposed on and along the external frame part in plan view. Therefore, it is possible to make the part of the external electrode terminal that is superimposed on the internal space as small as possible. In this way, it is possible to reduce stress that acts on the sealing part because of deformation of the second sealing member when the piezoelectric resonator device is mounted on an external circuit board, and thus, it is possible to improve airtightness of the sealing part.

MEANS FOR CARRYING OUT THE INVENTION

Hereinafter, an embodiment of the present invention will be described in detail with reference to the drawings. In the following embodiment, a piezoelectric resonator device to which the present invention is applied is a crystal oscillator.

Figure 1:
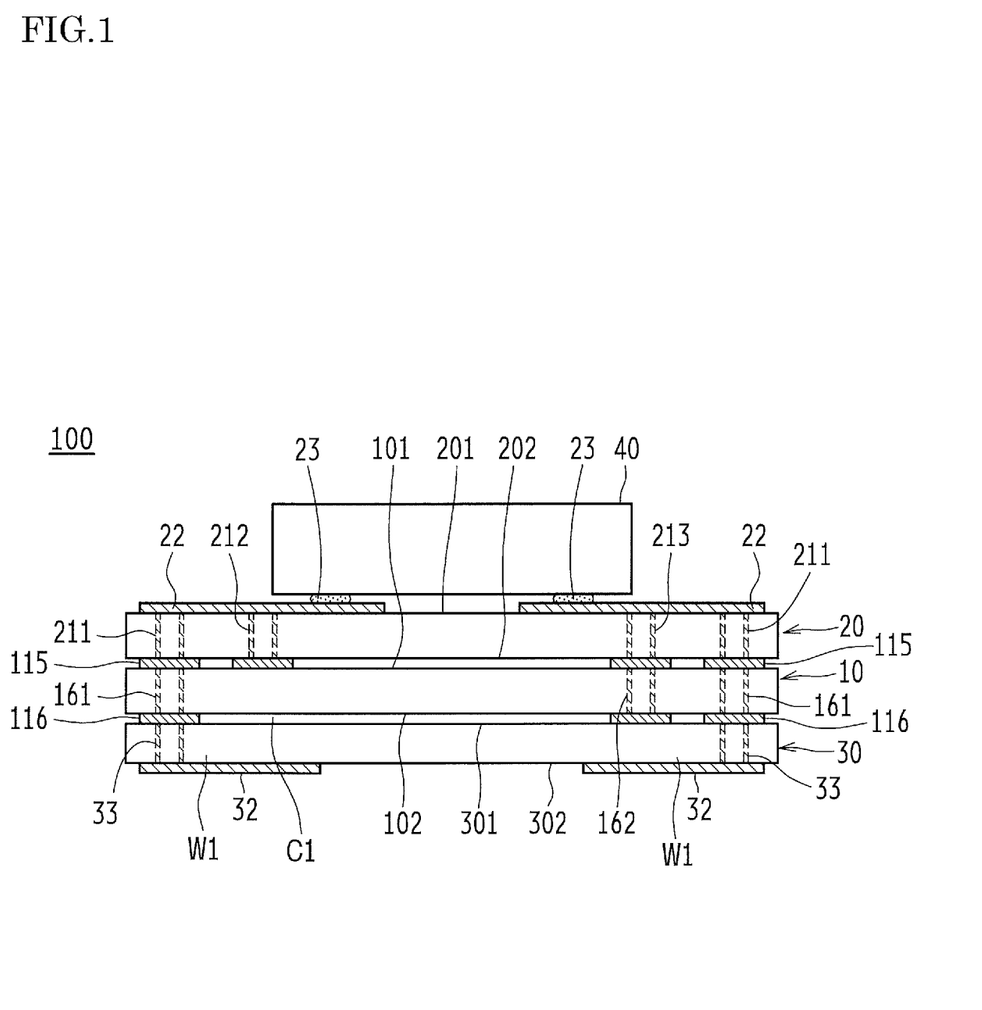
FIG. 1 is a schematic configuration diagram schematically illustrating a configuration of a crystal oscillator according to an embodiment.

First, the basic configuration of a crystal oscillator 100 according to this embodiment is described. As shown in FIG. 1, the crystal oscillator 100 includes: a crystal resonator plate (piezoelectric resonator plate) 10; a first sealing member 20; a second sealing member 30; and an IC chip 40. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) C1 of the package is formed. In this internal space C1, a vibrating part 11 (see FIGS. 4 and 5) is hermetically sealed.

Also, the IC chip 40 is mounted on a main surface, which is opposite to a surface bonded to the crystal resonator plate 10, of the first sealing member 20. The IC chip 40 as an electronic component element is a one-chip integrated circuit element constituting, with the crystal resonator plate 10, an oscillation circuit.

The crystal oscillator 100 according to this embodiment has, for example, a package size of 1.0×0.8 mm, which is reduced in size and height. According to the size reduction, no castellation is formed in the package. Through holes (described later) are used for conduction between electrodes.

Next, the respective components of the above-described crystal oscillator 100 (i.e. the crystal resonator plate 10, the first sealing member 20 and the second sealing member 30) are described with reference to FIGS. 1 to 7. Here, each of the components is described as a single body without being bonded. FIGS. 2 to 7 merely show respective configuration examples of the crystal resonator plate 10, the first sealing member 20 and the second sealing member 30, and thus the present invention is not limited thereto.

Figure 4:
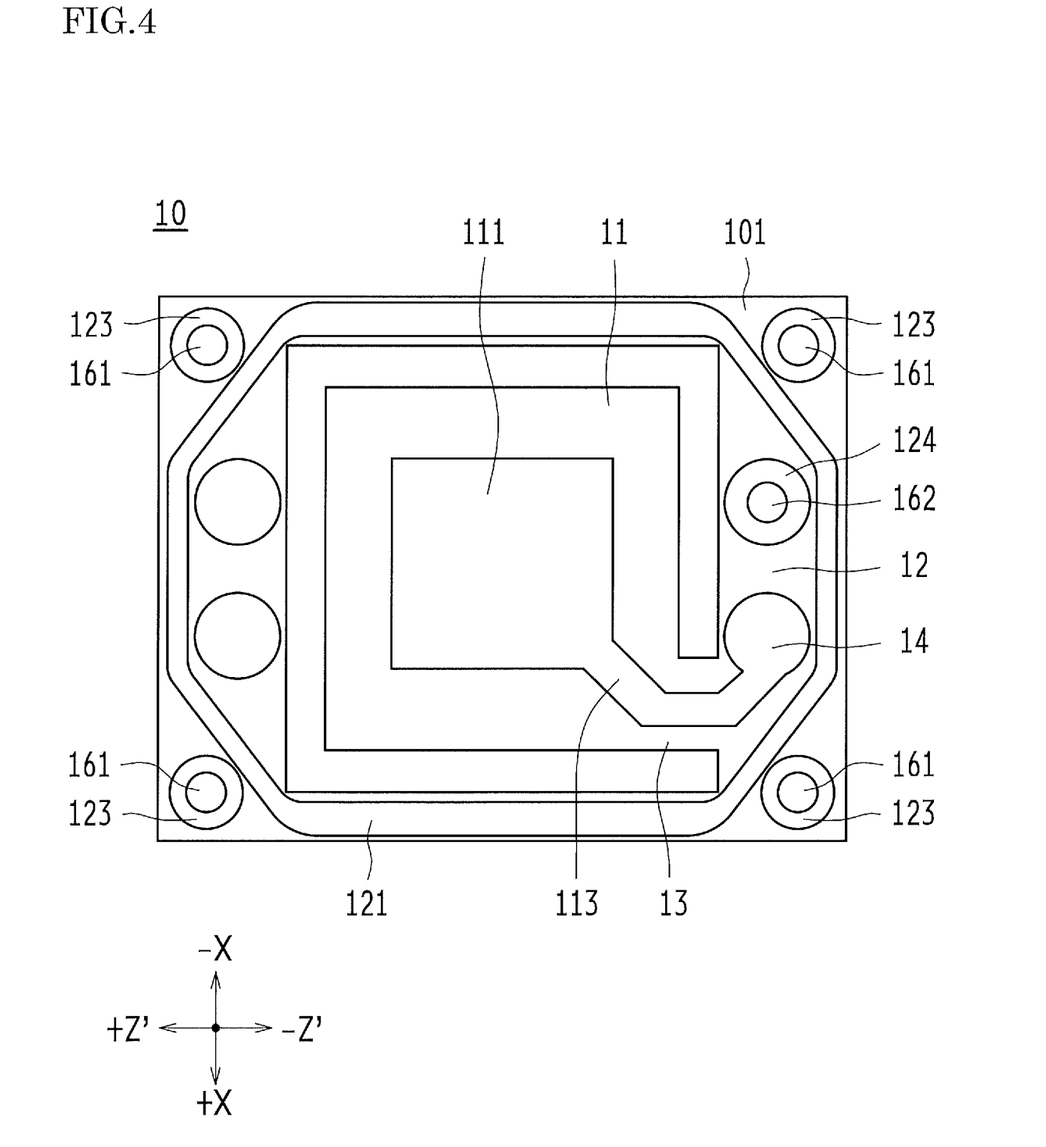
FIG. 4 is a schematic plan view illustrating a first main surface of a crystal resonator plate of the crystal oscillator.
Figure 5:
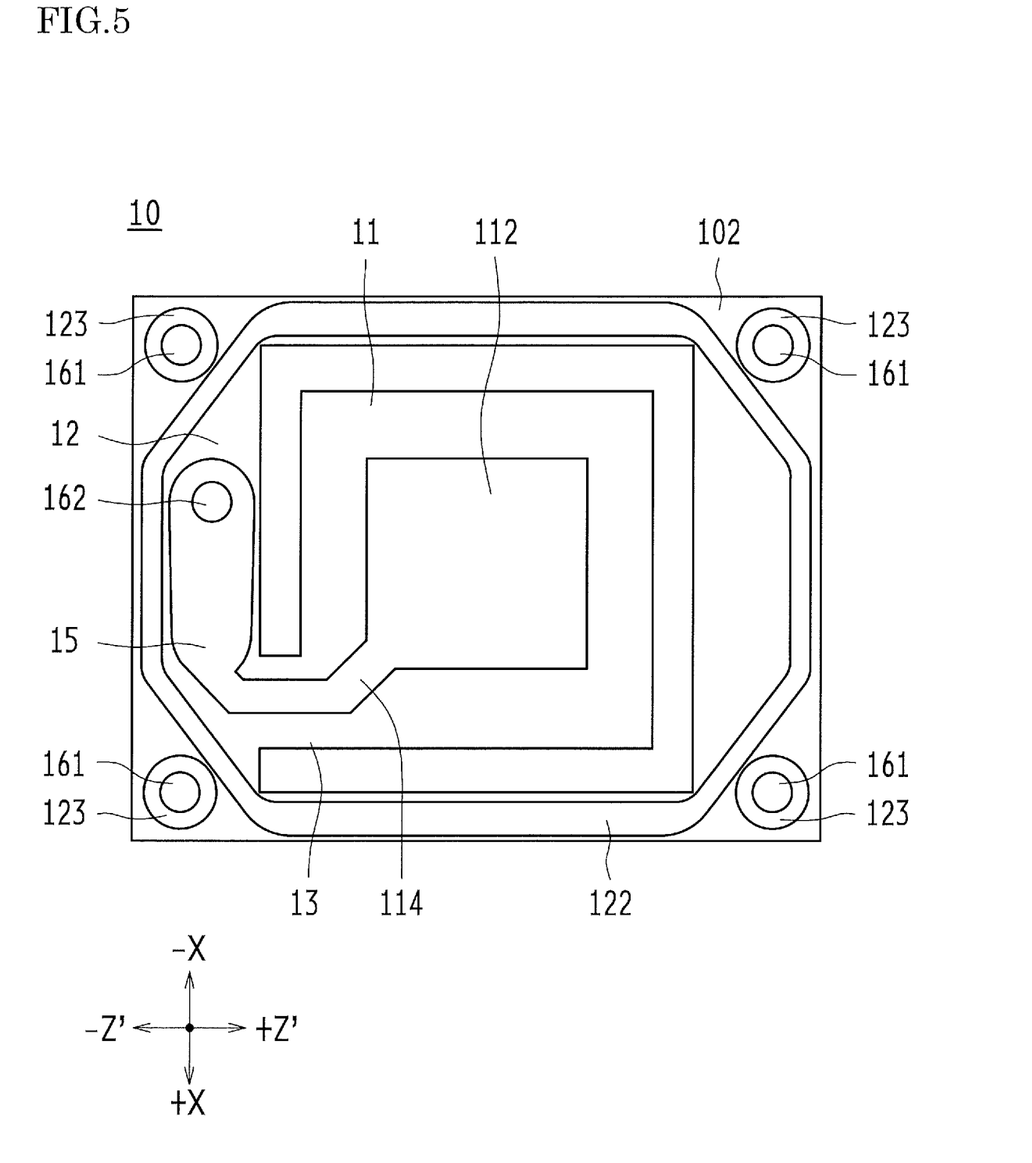
FIG. 5 is a schematic plan view illustrating a second main surface of the crystal resonator plate of the crystal oscillator.

The crystal resonator plate 10 is a piezoelectric substrate made of crystal as shown in FIGS. 4 and 5. Each main surface (i.e. a first main surface 101 and a second main surface 102) is formed as a smooth flat surface (mirror-finished). In this embodiment, an AT-cut crystal plate that causes thickness shear vibration is used as the crystal resonator plate 10. In the crystal resonator plate 10 shown in FIGS. 4 and 5, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by approximately 35° 15' from the Y axis and the Z axis out of the crystal axes of the crystal (this cutting angle may be changed to a certain extent within the range in which the frequency temperature characteristics of the AT-cut crystal resonator plate can be adjusted). The Y' axis direction and the Z' axis direction correspond to the directions in which the AT-cut crystal is cut out.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to pieces of lead-out wiring (a first lead-out wiring 113 and a second lead-out wiring 114)

so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 4 and 5, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 4 and 5, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective central parts of the first through holes 161 and the second through hole 162 are hollow penetrating parts penetrating between the first main surface 101 and the second main surface 102.

Figure 2:
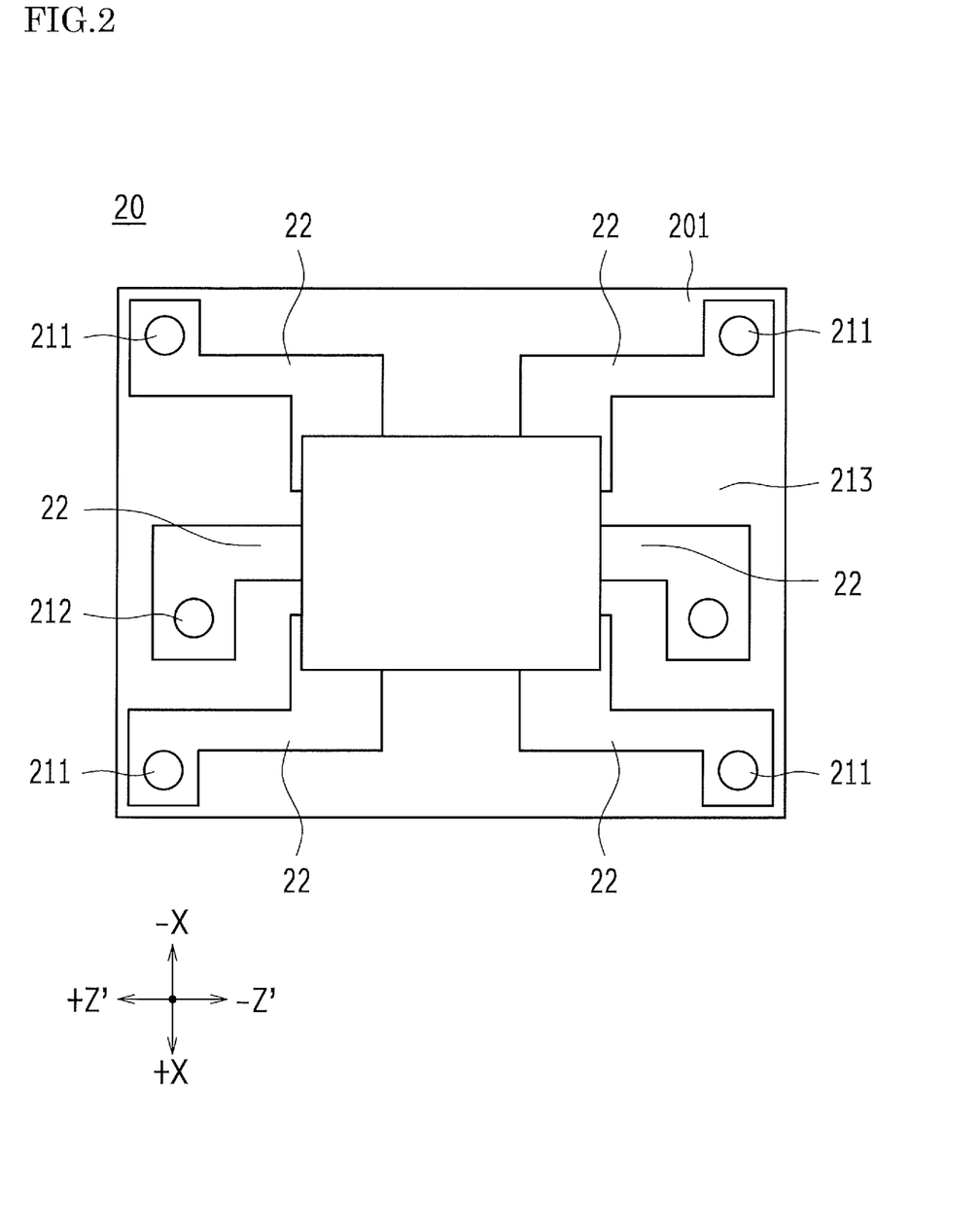
FIG. 2 is a schematic plan view illustrating a first main surface of a first sealing member of the crystal oscillator.
Figure 3:
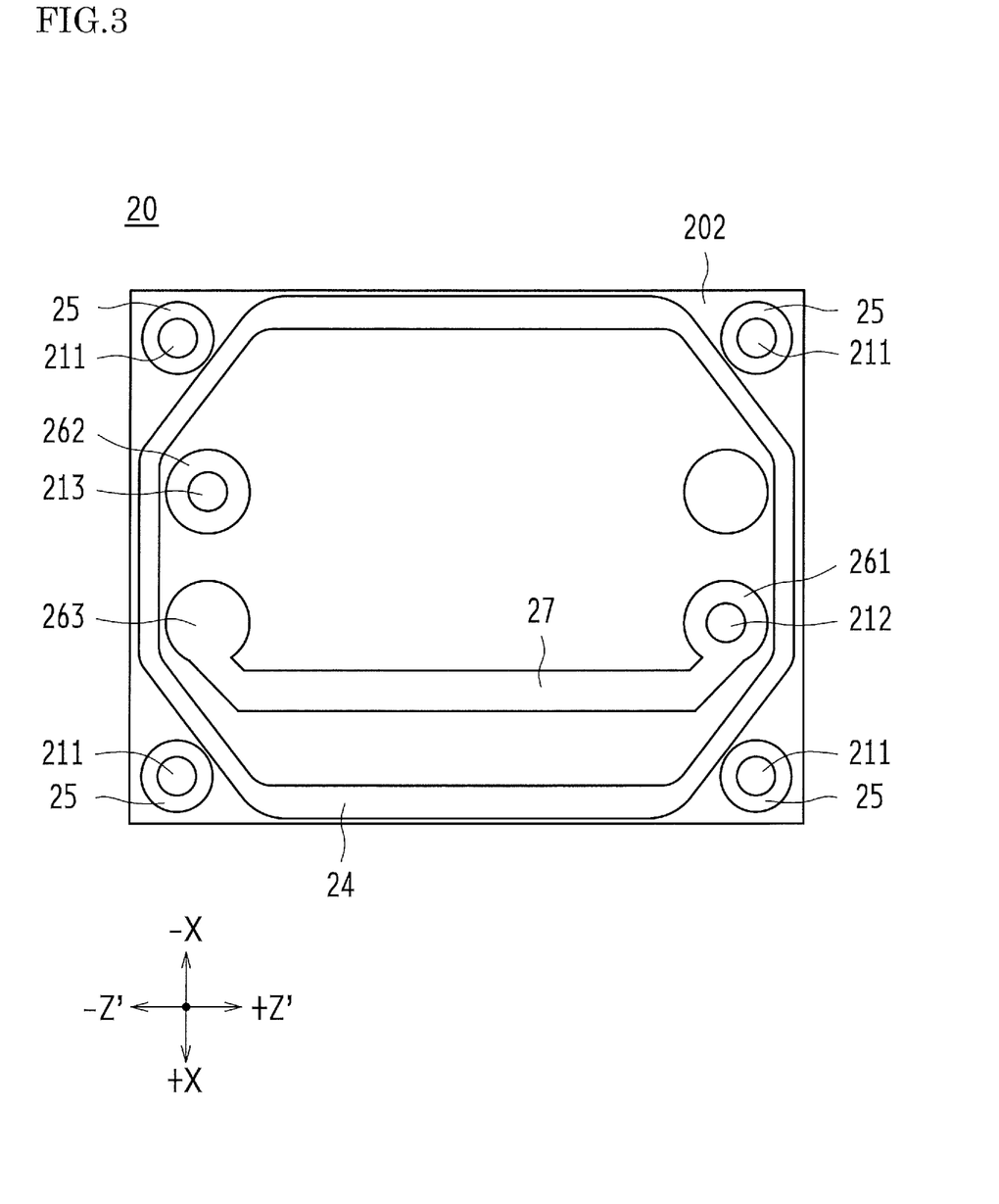
FIG. 3 is a schematic plan view illustrating a second main surface of the first sealing member of the crystal oscillator.

As shown in FIGS. 2 and 3, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 2, on a first main surface 201 (the surface on which the IC chip 40 is mounted) of the first sealing member 20, six electrode patterns 22 are formed, which include mounting pads for mounting the IC chip 40 as an oscillation circuit element. The IC chip 40 is bonded to the electrode patterns 22 by the flip chip bonding (FCB) method using a metal bump (for example, Au bump) 23 (see FIG. 1).

As shown in FIGS. 2 and 3, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 2 and 3.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective central parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 6:
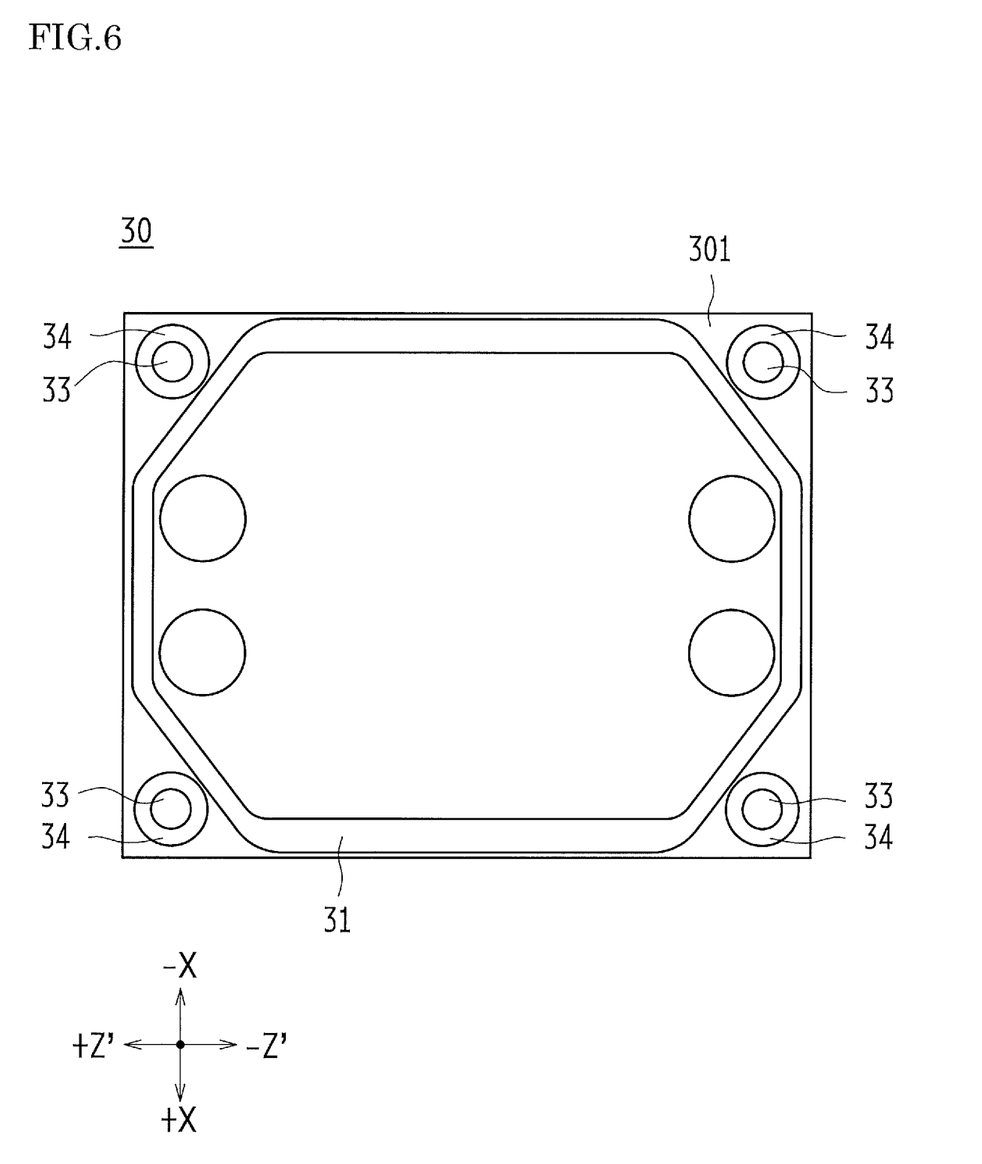
FIG. 6 is a schematic plan view illustrating a first main surface of a second sealing member of the crystal oscillator.
Figure 7:
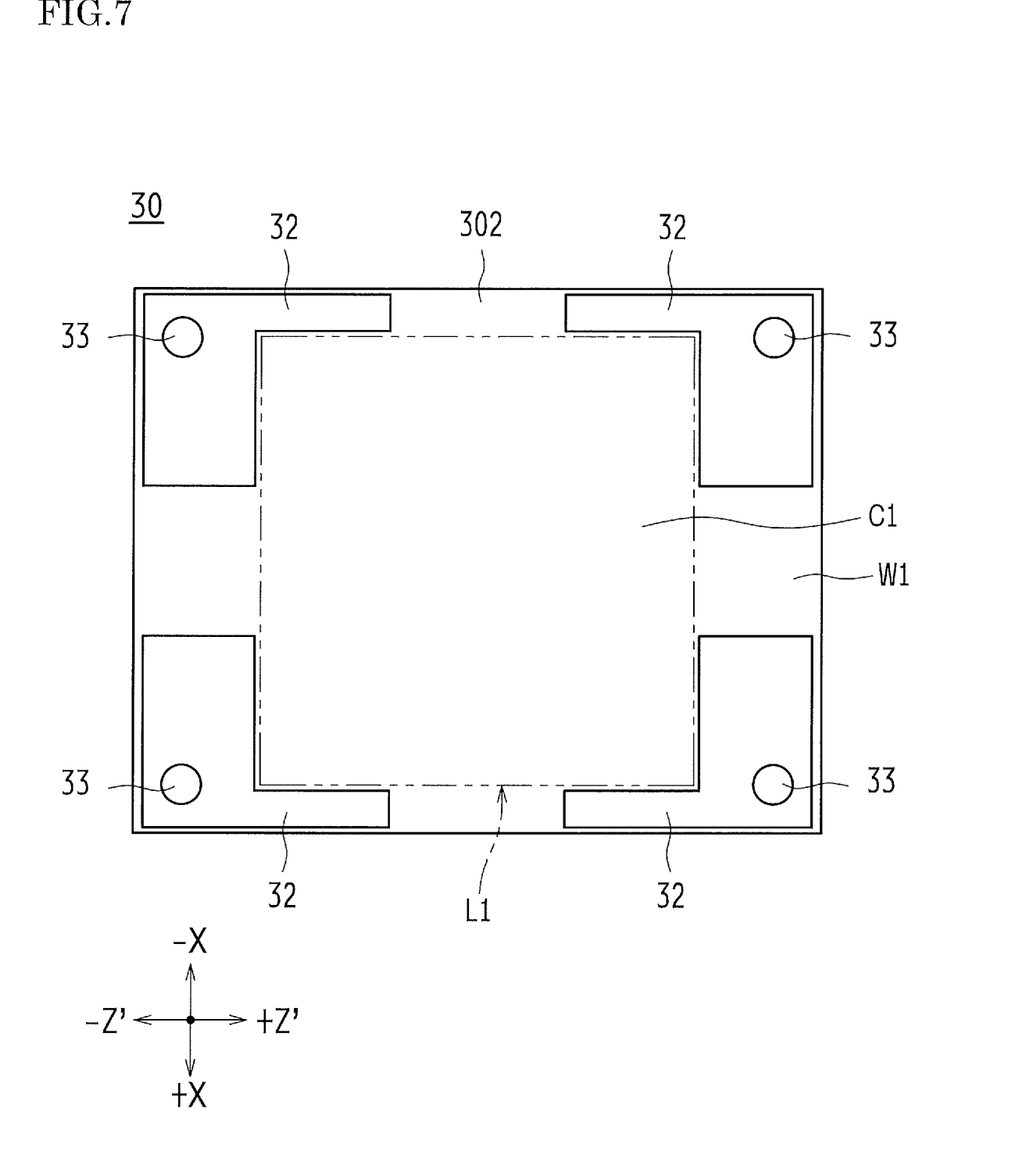
FIG. 7 is a schematic plan view illustrating a second main surface of the second sealing member of the crystal oscillator.

As shown in FIGS. 6 and 7, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

Four external electrode terminals 32, which are electrically connected to an external circuit board (not shown) provided outside the crystal oscillator 100, are formed on a second main surface 302 (the outer main surface not facing the crystal resonator plate 10) of the second sealing member 30. The external electrode terminals 32 are respectively located on the four corners (corner parts) on the second main surface 302 of the second sealing member 30.

As shown in FIGS. 6 and 7, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the above through holes so as to establish conduction between the electrodes formed on the first main surface 301 and the second main surface 302. In this way, the respective electrodes formed on the first main surface 301 are electrically conducted to the external electrode terminals 32 formed on the second main surface 302 via the through electrodes formed along the inner wall surfaces of the through holes. Also, respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 1 is produced. Accordingly, the internal space C1 of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the IC chip 40 and the external electrode terminals 32 of the crystal oscillator 100.

More specifically, the first excitation electrode 111 is connected to the IC chip 40 via the first lead-out wiring 113, the wiring pattern 27, the fourth through hole 212 and the electrode pattern 22 in this order. The second excitation electrode 112 is connected to the IC chip 40 via the second lead-out wiring 114, the second through hole 162, the fifth through hole 213 and the electrode pattern 22 in this order. Also, the IC chip 40 is connected to the external electrode terminals 32 via the electrode patterns 22, the third through holes 211, the first through holes 161 and the sixth through holes 33 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other pieces of wiring and electrodes formed on the crystal oscillator 100 each preferably have the same configuration as the bonding patterns, which leads to patterning of the bonding patterns, the pieces of wiring and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In the crystal oscillator 100 having the seal paths 115 and 116 formed by the diffusion bonding as described above, the first sealing member 20 and the crystal resonator plate 10 have a gap of not more than 1.00 μm. The second sealing member 30 and the crystal resonator plate 10 have a gap of not more than 1.00 μm. That is, the thickness of the seal path 115 between the first sealing member 20 and the crystal resonator plate 10 is not more than 1.00 μm, and the thickness of the seal path 116 between the second sealing member 30 and the crystal resonator plate 10 is not more than 1.00 μm (specifically, the thickness in the Au—Au bonding in this embodiment is 0.15 to 1.00 μm). As a comparative example, the conventional metal paste sealing material containing Sn has a thickness of 5 to 20 μm.

In this embodiment, a plurality of (four in this embodiment) external electrode terminals 32 is formed on the second main surface (the other main surface) 302 of the second sealing member 30 so as to be connected to an external circuit board. The respective external electrode terminals 32 are disposed on and along an external frame part W1 surrounding the internal space C1 in plan view. Hereinafter, this configuration is described.

In FIG. 7, a boundary line L1 between the internal space C1 and the external frame part W1 is indicated by the dashed and double-dotted line. That is, the boundary line L1 is an outer peripheral edge of the internal space C1 and an inner peripheral edge of the external frame part W1. In this embodiment, the boundary line L1 is disposed substantially on the same position as the inner peripheral edge of the external frame part 12 of the crystal resonator plate 10 in plan view.

The external frame part W1 is a part of the crystal oscillator 100, at which the first sealing member 20 adheres tightly to the crystal resonator plate 10 as well as the second sealing member 30 adheres tightly to the crystal resonator plate 10, both in a state in which there is substantially no gap. Here, the expression "tight adhesion in the state in which there is substantially no gap" means the tight adhesion of the first sealing member 20 to the crystal resonator plate 10 and the tight adhesion of the second sealing member 30 to the crystal resonator plate 10, both having a gap not more than the above-described gap value (1.00 μm). In this embodiment, the external frame part W1 is disposed substantially on the same position as the external frame part 12 of the crystal resonator plate 10 in plan view.

The internal space C1 is a part of the crystal oscillator 100, at which the first sealing member 20 does not adhere to the crystal resonator plate 10 and the second sealing member 30 does not adhere to the crystal resonator plate 10, thus there is a gap. In this case, the gap between the first sealing member 20 and the crystal resonator plate 10 as well as the gap between the second sealing member 30 and the crystal resonator plate 10 are both larger than the above-described gap value (1.00 μm). Also, the space between the vibrating part 11 and the external frame part 12 of the crystal resonator plate 10 constructs the internal space C1. The internal space C1 is disposed within the inner peripheries of the seal paths 115 and 116. In this embodiment, the internal space C1 is disposed so as to substantially match a region inner than the external frame part 12 of the crystal resonator plate 10 in plan view.

In this embodiment, the four external electrode terminals 32 formed on the second main surface 302 of the second sealing member 30 are respectively disposed on and along the external frame part W1 surrounding the internal space C1 in plan view. Specifically, the external electrode terminals 32 are respectively superimposed on only the external frame part W1 in plan view and thus do not straddle the external frame part W1 and the internal space C1. The external electrode terminals 32 are disposed on the four corners of the second main surface 302 of the second sealing member 30. The external electrode terminals 32 are each formed so as to have a substantially L-shape in plan view. Each of the external electrode terminals 32 has an X axis direction part extending in the X axis direction and a Z' axis direction part extending in the Z' axis direction. An end of the X axis direction part and an end of the Z' axis direction part are connected to each other at each of the four corners of the second main surface 302 of the second sealing member 30.

According to this embodiment, the external electrode terminals 32 are respectively disposed on and along the external frame part W1 in plan view. Thus, it is possible to reduce the stress acting on the seal paths 115 and 116 when the crystal oscillator 100 is mounted on an external circuit board, which leads to improvement of airtightness of the seal paths 115 and 116. Hereinafter, detailed description will be given on this feature.

When the crystal oscillator 100 is mounted on an external circuit board, the external electrode terminals 32 are connected to the external circuit board using a conductive adhesive such as solder. Since the conductive adhesive such as solder contracts at the time of mounting the crystal oscillator 100 on the external circuit board, tensile stress or compressive stress acts on the second sealing member 30 in the Z' axis direction via the external electrode terminals 32. That is, when mounting the crystal oscillator 100 on the external circuit board, the stress is generated to deform and warp the second sealing member 30, and this stress may affect the seal paths 115 and 116. In this case, the larger the part of the external electrode terminal 32 that is superimposed on the internal space C1 in plan view becomes, the larger the stress that acts on the seal paths 115 and 116 may become, due to deformation of the second sealing member 30 when the crystal oscillator 100 is mounted on the external circuit board. As a result, it may be difficult to ensure the airtightness of the seal paths 115 and 116. The above problem may be considered to occur from the fact that each of the external electrode terminals 32 is disposed so as to have a relatively stable part that is superimposed on the external frame part W1 and a relatively unstable part that is superimposed on the internal space C1.

In contrast to the above, in this embodiment, each of the external electrode terminals 32 is disposed on and along the external frame part W1 in plan view. Therefore, it is possible to make the part of the external electrode terminal 32 that is superimposed on the internal space C1 as small as possible. In this way, it is possible to reduce the stress that acts on the seal paths 115 and 116 because of deformation of the second sealing member 30 when the crystal oscillator 100 is mounted on the external circuit board, and thus, it is possible to improve the airtightness of the seal paths 115 and 116.

Furthermore, since the external electrode terminals 32 are respectively superimposed on only the external frame part W1 in plan view and thus do not straddle the external frame part W1 and the internal space C1, the external electrode terminals 32 are not needed to have a part that is superimposed on the internal space C1. In this way, it is possible to reduce the stress that acts on the seal paths 115 and 116 because of deformation of the second sealing member 30 when the crystal oscillator 100 is mounted on the external circuit board, and thus, it is possible to improve the airtightness of the seal paths 115 and 116.

Also, the external electrode terminals 32 are respectively located on the four corners on the second main surface 302 of the second sealing member 30, and each external electrode terminal 32 is formed so as to have a substantially L-shape in plan view. In this way, since the four external electrode terminals 32 are disposed so as to surround the internal space C1 in plan view, it is possible to make efficiently use of the limited area of the external frame part W1 to provide the external electrode terminals 32 thereon.

Also in this embodiment, the external electrode terminals 32 are provided only on the second main surface 302 of the second sealing member 30, not on the first main surface 301 of the first sealing member 20. On the first main surface 201 of the first sealing member 20, the electrode patterns 22 are provided so as to mount the IC chip 40 thereon. That is, the external electrode terminals 32 are provided on one side (i.e. on the side of the second sealing member) of the crystal oscillator 100. Furthermore, in the crystal oscillator 100, the external electrode terminals 32 on the second sealing member 30 have the same film composition (layer composition) as that of the electrode patterns 22 on the first sealing member 20. In other words, the external electrode terminals 32 can have the same film composition as the above-described various bonding patterns. More specifically, the external electrode terminals 32 and the electrode patterns 22 are each made of a plurality of laminated layers, preferably, a Ti (titanium) layer and an Au (gold) layer deposited by the vapor deposition in this order from the lowermost layer side. Thus, it is preferable that the film composition of the external electrode terminals 32 and the electrode patterns 22 is the same as the film composition of the other bonding patterns, wiring and electrodes formed in the crystal oscillator 100, because in this case, the external electrode terminals 32 and the electrode patterns 22 can be made by patterning at the same time as patterning of the other bonding patterns, wiring and electrodes formed in the crystal oscillator 100. In addition, since the external electrode terminals 32 on the second sealing member 30 have the same film composition (layer composition) as that of the electrode patterns 22 on the first sealing member 20, the stress balance of the film composition can be unified, which contributes to a more preferable configuration.

The above-disclosed embodiment is to be considered in all respects as illustrative and not limiting. The technical scope of the invention is indicated by the appended claims rather than by the foregoing embodiment, and all modifications and changes that come within the meaning and range of equivalency of the claims are intended to be embraced therein.

In the above-described embodiment, the present invention is applied to the crystal oscillator 100. However, the present invention is not limited thereto. The present invention may be applied to a crystal resonator having a configuration in which the first sealing member 20, the crystal resonator plate 10 and the second sealing member 30 are laminated.

Figure 8:
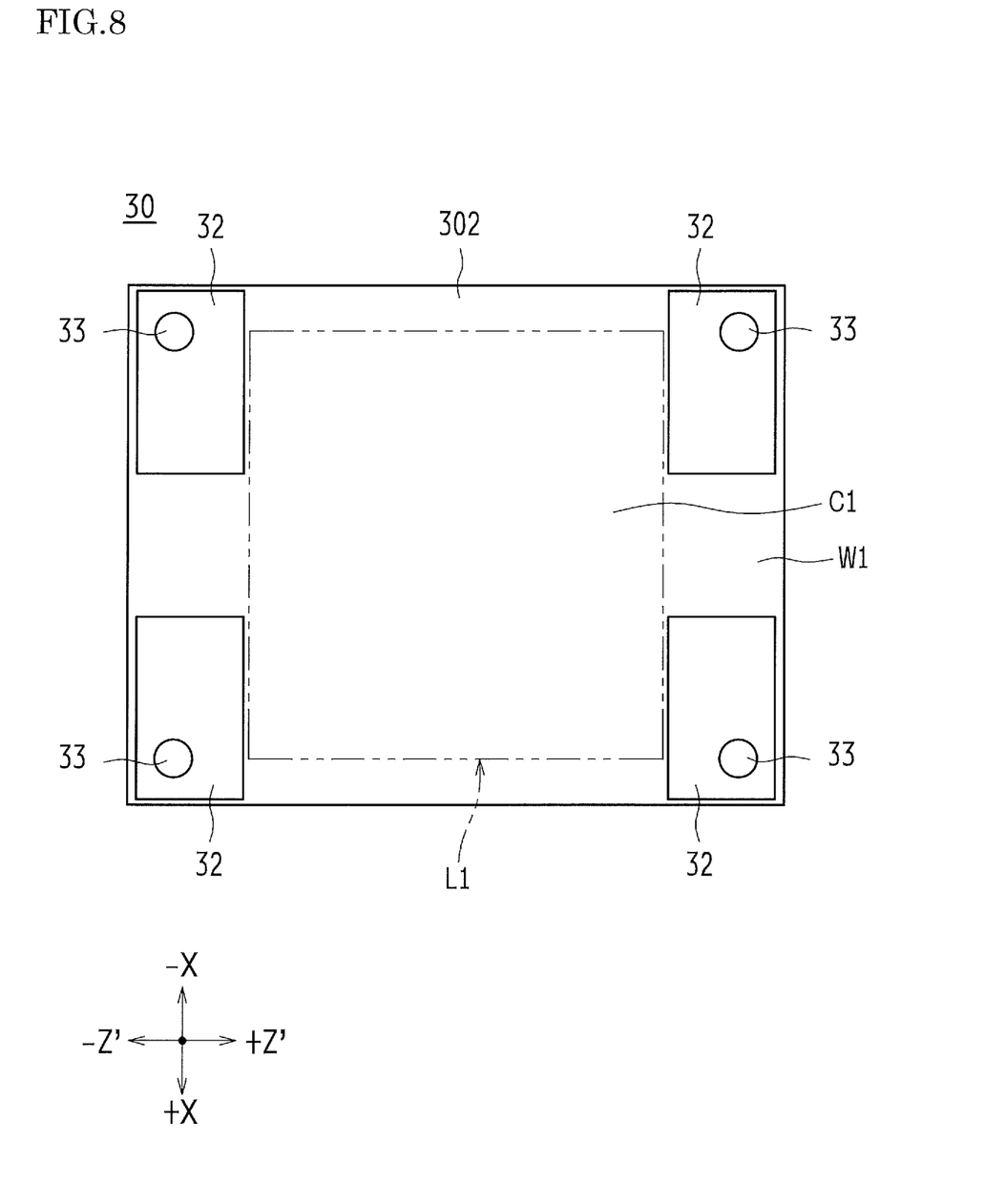
FIG. 8 is a schematic plan view corresponding to FIG. 7, which illustrates a crystal oscillator according to a variation.

In the above-described embodiment, the number of the external electrode terminals 32 on the second main surface 302 of the second sealing member 30 is four. However, the present invention is not limited thereto. The number of the external electrode terminals 32 may be, for example, two, six, or eight. Also, as to the shape of the external electrode terminal 32, it is not limited to the substantially L-shape. It may be any shape appropriately made. For example, as shown in FIG. 8, the external electrode terminal 32 may have a substantially rectangular shape constituted of only an X axis direction part extending in the X axis direction. Furthermore, not all the external electrode terminals 32 are required to have the same shape. That is, one of the four external electrode terminals 32 may have, for example, a shape including a protrusion or a cut-out for marking.

Also in the above-described embodiment, the external electrode terminal 32 is disposed so as to be superimposed on only the external frame part W1 in plan view. However, part of the external electrode terminal 32 may be superimposed on the internal space C1. In this case, it is preferable that, from the viewpoint of minimization of the part of the external electrode terminal 32 that is superimposed on the internal space C1, almost all the part of the external electrode terminal 32 (for example, the part that accounts for 90% or more of the area thereof) is superimposed on the external frame part W1 while the remaining small part (for example, the part that accounts for 10% or less of the area thereof) is superimposed on the internal space C1.

In the above-described embodiment, the second main surface 202 of the first sealing member 20 and the first main surface 301 of the second sealing member 30 are both flat surfaces. However, the present invention is not limited thereto. A recess part may be formed in at least one of the second main surface 202 of the first sealing member 20 and the first main surface 301 of the second sealing member 30. Also, the vibrating part 11 of the crystal resonator plate 10 may be thinner than the external frame part 12.

Also in the above-described embodiment, the first sealing member 20 and the second sealing member 30 are each made of a crystal plate. However, the present invention is not limited thereto. The first sealing member 20 and the second sealing member 30 may be made of, for example, glass or ceramic.

This application claims priority based on Patent Application No. 2018-234555 filed in Japan on Dec. 14, 2018. The entire contents thereof are hereby incorporated in this application by reference.

DESCRIPTION OF REFERENCE NUMERALS

10 Crystal resonator plate (piezoelectric resonator plate)
11 Vibrating part
20 First sealing member
30 Second sealing member
32 External electrode terminal
100 Crystal oscillator (piezoelectric resonator device)
111 First excitation electrode
112 Second excitation electrode
115, 116 Seal path (sealing part)
302 Second main surface (other main surface)
C1 Internal space
W1 External frame part

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member including a first main surface and a second main surface and covering the first excitation electrode of the piezoelectric resonator plate, the second main surface of the first sealing member facing the first main surface of the substrate;
a second sealing member including a first main surface and a second main surface and covering the second excitation electrode of the piezoelectric resonator plate, the first main surface of the second sealing member facing the second main surface of the substrate; and
an internal space between the first sealing member bonded to the piezoelectric resonator plate and the second sealing member bonded to the piezoelectric resonator plate, the internal space hermetically sealing a vibrating part including the first excitation electrode and the second excitation electrode of the piezoelectric resonator plate, wherein
a sealing part that hermetically seals the vibrating part of the piezoelectric resonator plate is formed so as to have an annular shape in plan view, and
a plurality of external electrode terminals electrically connected to an external circuit board is formed on the second main surface of the second sealing member, and each of the plurality of external electrode terminals is disposed on and along an external frame part surrounding the internal space in plan view such that a large part of each of the plurality of external electrode terminals is not superimposed on the internal space in plan view.

2. The piezoelectric resonator device according to claim 1, wherein
each of the plurality of external electrode terminals is superimposed on only the external frame part in plan view.

3. The piezoelectric resonator device according to claim 1, wherein
each of the plurality of external electrode terminals is located on a corresponding corner part on the second main surface of the second sealing member.

4. The piezoelectric resonator device according to claim 3, wherein
the plurality of external electrode terminals is respectively located on four corners on the second main surface of the second sealing member.

5. The piezoelectric resonator device according to claim 1, wherein
each of the plurality of external electrode terminals is formed so as to have a substantially L-shape in plan view.

6. The piezoelectric resonator device according to claim 2, wherein
each of the plurality of external electrode terminals is located on a corresponding corner part on the second main surface of the second sealing member.

7. The piezoelectric resonator device according to claim 6, wherein
the plurality of external electrode terminals is respectively located on four corners on the second main surface of the second sealing member.

8. The piezoelectric resonator device according to claim 2, wherein
each of the plurality of external electrode terminals is formed so as to have a substantially L-shape in plan view.

9. The piezoelectric resonator device according to claim 3, wherein
each of the plurality of external electrode terminals is formed so as to have a substantially L-shape in plan view.

10. The piezoelectric resonator device according to claim 4, wherein
each of the plurality of external electrode terminals is formed so as to have a substantially L-shape in plan view.

11. The piezoelectric resonator device according to claim 6, wherein
each of the plurality of external electrode terminals is formed so as to have a substantially L-shape in plan view.

12. The piezoelectric resonator device according to claim 7, wherein
each of the plurality of external electrode terminals is formed so as to have a substantially L-shape in plan view.

13. The piezoelectric resonator device according to claim 1, wherein
the large part comprises a part that accounts for 90% or more of an area of each of the plurality of external electrode terminals and is not superimposed on the external frame part in plan view.

14. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member including a first main surface and a second main surface and covering the first excitation electrode of the piezoelectric resonator plate, the second main surface of the first sealing member facing the first main surface of the substrate;
a second sealing member including a first main surface and a second main surface and covering the second excitation electrode of the piezoelectric resonator plate, the first main surface of the second sealing member facing the second main surface of the substrate; and
an internal space between the first sealing member bonded to the piezoelectric resonator plate and the second sealing member bonded to the piezoelectric resonator plate, the internal space hermetically sealing a vibrating part including the first excitation electrode and the second excitation electrode of the piezoelectric resonator plate, wherein
a sealing part that hermetically seals the vibrating part of the piezoelectric resonator plate is formed so as to have an annular shape in plan view, and a plurality of external electrode terminals electrically connected to an external circuit board is formed on the second main surface of the second sealing member, and each of the plurality of external electrode terminals is disposed on and along an external frame part surrounding the internal space in plan view, and
the internal space is surrounded by the external frame part where the piezoelectric resonator plate is in close contact with the first sealing member with a gap of not more than 1.00 μm and the piezoelectric resonator plate is in close contact with the second sealing member with a gap of not more than 1.00 μm.

15. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member including a first main surface and a second main surface and covering the first excitation electrode of the piezoelectric resonator plate, the second main surface of the first sealing member facing the first main surface of the substrate;
a second sealing member including a first main surface and a second main surface and covering the second excitation electrode of the piezoelectric resonator plate, the first main surface of the second sealing member facing the second main surface of the substrate; and
an internal space between the first sealing member bonded to the piezoelectric resonator plate and the second sealing member bonded to the piezoelectric resonator plate, the internal space hermetically sealing a vibrating part including the first excitation electrode and the second excitation electrode of the piezoelectric resonator plate, wherein
a sealing part that hermetically seals the vibrating part of the piezoelectric resonator plate is formed so as to have an annular shape in plan view, and a plurality of external electrode terminals electrically connected to an external circuit board is formed on the second main surface of the second sealing member, and each of the plurality of external electrode terminals is disposed on and along an external frame part surrounding the internal space in plan view,
the piezoelectric resonator plate and the first sealing member are provided with a gap of not more than 1.00 μm therebetween, and
the piezoelectric resonator plate and the second sealing member are provided with a gap of not more than 1.00 μm therebetween.

\* \* \* \* \*